United States Patent [19]
Kaji et al.

[11] Patent Number: 5,432,315
[45] Date of Patent: Jul. 11, 1995

[54] PLASMA PROCESS APPARATUS INCLUDING GROUND ELECTRODE WITH PROTECTION FILM

[75] Inventors: Tetsunori Kaji, Tokuyama; Takashi Fujii; Motohiko Yoshigai, both of Kudamatsu; Yoshinao Kawasaki, Yamaguchi; Masaharu Nishiumi, Kudamatsu, all of Japan

[73] Assignee: Hitachi, Ltd., Tokyo, Japan

[21] Appl. No.: 203,035

[22] Filed: Feb. 28, 1994

Related U.S. Application Data

[63] Continuation-in-part of Ser. No. 890,184, May 29, 1992, Pat. No. 5,290,993.

[30] Foreign Application Priority Data

May 31, 1991 [JP] Japan .................. 3-129064

[51] Int. Cl.⁶ .............................. B23K 10/00
[52] U.S. Cl. .................. 219/121.43; 219/121.4; 219/121.41; 156/345; 204/298.17; 204/298.37; 216/70
[58] Field of Search ............ 219/121.43, 121.44; 156/345, 643, 646; 204/298.17, 298.37, 298.38; 315/111.21, 111.51

[56] References Cited

U.S. PATENT DOCUMENTS

| | | | |
|---|---|---|---|
| 4,889,609 | 12/1989 | Cannella | 219/121.43 |
| 5,081,421 | 1/1992 | Miller et al. | 324/671 |
| 5,200,053 | 6/1993 | Shimomura et al. | 204/435 |
| 5,272,417 | 12/1993 | Ohmi | 315/111.21 |
| 5,298,290 | 3/1994 | Jost et al. | 427/489 |

FOREIGN PATENT DOCUMENTS 3242928 10/1991 Japan ............... 219/121.43

Primary Examiner—Mark H. Paschall
Attorney, Agent, or Firm—Antonelli, Terry, Stout & Kraus

[57] ABSTRACT

A microwave plasma processing apparatus includes a vacuum chamber which is evacuated to a predetermined pressure and into which processing gas is introduced, a sample table, disposed in the vacuum chamber, to which an AC voltage is applied, a microwave generating device for generating microwaves and introducing the microwaves towards a surface to be processed of a sample located on the sample table, a magnetic field generating device for generating a magnetic field in the vacuum chamber, an insulator disposed on a part of the vacuum chamber exposed to a plasma produced in the vacuum chamber by interaction of the processing gas, the microwaves, and the magnetic field, and a ground electrode disposed in the vacuum chamber at a place which is on a microwave introduction side of the vacuum chamber with respect to the surface of the sample table on which the sample is placed, a surface of the ground electrode being covered by a semiconducting thin film.

17 Claims, 5 Drawing Sheets

PLASMA PROCESS APPARATUS INCLUDING GROUND ELECTRODE WITH PROTECTION FILM

CROSS-REFERENCE TO RELATED APPLICATION

This is a continuation-in-part of application Ser. No. 890,184 filed on May 29, 1992, now U.S. Pat. No. 5,290,993.

BACKGROUND OF THE INVENTION

The present invention relates to a plasma processing apparatus and in particular to a plasma processing apparatus suitable for formation of various sorts of films, etching processing therefor, etc., effected in semiconductor element fabrication, etc.

Recently, down sizing and higher density integration of semiconductor elements have continued to progress. A microwave plasma processing apparatus can be cited as a processing apparatus suitable for such down sizing. A prior art microwave plasma processing apparatus described e.g. in Japanese Utility Model Publication Laid-Open No. 2-67632 is known. In this microwave plasma processing apparatus, a bell jar made of quartz is disposed in the upper part of a vacuum chamber, in which a sample table is disposed, a waveguide, at an end of which a magnetron is mounted, is disposed around the quartz bell jar, a coil for generating a magnetic field is disposed around the quartz bell jar through the magnetic waveguide, a high frequency power supply is connected with the sample table, and a movable ground plate is disposed around a sample placed on the sample table. The apparatus described above operates as follows. Gas is introduced into the vacuum chamber through a processing gas introducing tube. Microwaves from the magnetron are injected in the quartz bell jar and at the same time a magnetic field is generated in the quartz bell jar. In this way, plasma is produced by the effect of the microwaves and the magnetic field in the quartz bell jar, and a bias voltage is produced by applying a high frequency voltage to the sample table. At this time, the height of the ground plate is regulated so that a potential distribution is made uniform.

In the prior art technique described above, no attention was paid to metal contamination by the ground plate, and there was a problem that the ground plate was sputtered by ions in the plasma generated in the quartz bell jar and sputter particles were scattered in the vacuum chamber to contaminate the sample.

The object of the present invention is to provide a plasma processing apparatus capable of effect stable plasma processing without any metal contamination.

SUMMARY OF THE INVENTION

In order to achieve the above object, a microwave plasma processing apparatus according to the present invention includes a vacuum chamber which is evacuated to a predetermined pressure and into which processing gas is introduced, a sample table, disposed in the vacuum chamber, to which an AC voltage is applied, a microwave generating device for generating microwaves and introducing the microwaves towards a surface to be processed of a sample located on the sample table, a magnetic field generating device for generating a magnetic field in the vacuum chamber, an insulator disposed on a part of the vacuum chamber exposed to a plasma produced in the vacuum chamber by interaction of the processing gas, the microwaves, and the magnetic field, and a ground electrode disposed in the vacuum chamber at a place which is on a microwave introduction side of the vacuum chamber with respect to the surface of the sample table on which the sample is placed, a surface of the ground electrode exposed to the plasma being covered by a thin film capable of withstanding the plasma. The thin film may be an insulating thin film made of an insulator formed into a thin film, or a semiconducting thin film made of a semiconductor formed into a thin film.

Even if the ground electrode is exposed to the plasma, it is protected by the insulating or semiconducting thin film capable of withstanding the plasma. Thus, since the ground electrode is not sputtered, there is no fear of metal contamination. Further, since thin film is made of an insulator or semiconductor formed into a thin film and the bias voltage is produced by utilizing an AC voltage, it is possible to have AC electric power provided with a ground potential setting function with respect to the plasma and to effect a stable plasma processing.

The present invention is not limited to a plasma processing apparatus of the microwave type, but is applicable to a plasma processing apparatus having a region wherein a plasma is generated by energy supplied from a source other than microwaves, such as from an RF magnetic or electric field, and a region wherein a sample is treated while a bias voltage is applied to the sample.

DESCRIPTION OF THE PREFERRED EMBODIMENTS

Hereinbelow an embodiment of the present invention will be explained, referring to FIGS. 1 to 3.

A sample table 10 is disposed in a metal vessel 4. In an upper aperture portion of the metal vessel 4, in this case, a hemispherical quartz bell jar 3 is mounted hermetically to form a vacuum chamber. In the interior of the quartz bell jar 3, a plasma generating space is formed opposite to a surface of the sample table 10, on which a sample is placed.

Figure 2:
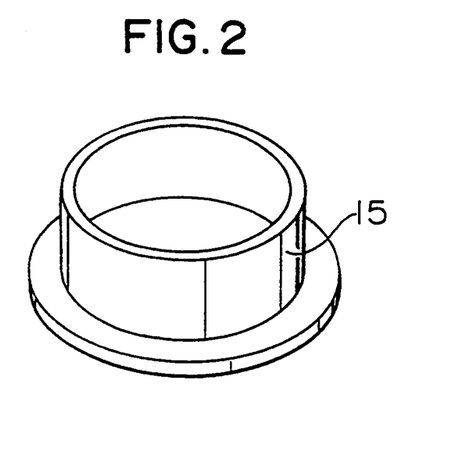
FIG. 2 is a perspective view showing a ground electrode used in the apparatus shown in FIG. 1.

A ring-shaped ground electrode 15, as shown in FIG. 2, is mounted in the upper portion of the metal vessel 4 and connected electrically with the grounded metal vessel 4. The ground electrode consists of an electrically conductive metal portion 15a such as aluminum, and an insulating or semiconducting thin film 15b several tens to several hundreds of micrometers (μm) thick, covering the outer surface thereof and made of e.g. alumina, aluminum fluoride, chromium oxide, silicon carbide, etc. At the place where the thin film 15b is formed, a potential difference is produced with respect to AC. However, it is possible to keep this potential difference at a small value at a frequency of AC above about 100 kHz (including several tens of kHz below 100 kHz), if $d/\xi\gamma \leq 1$ mm is satisfied, where $\xi\gamma$ denotes the specific dielectric constant of the material constituting the thin film 15b having a thickness of d (mm).

The lower part of the ground electrode 15 is formed in a flange shape, which is secured to the metal vessel 4 so that there is a gap between the ground electrode 15 and the inner surface of the metal vessel 4 as well as the quartz bell jar 3. A gas buffer 6 connected with a processing gas supplying device 5 is disposed on the peripheral portion of the metal vessel 4 and a path is formed so that the gas buffer 6 is connected with the gap between the quartz bell jar 3 and the ground electrode 15. An evacuating device 8 is connected with the lower portion of the metal vessel 4 through a valve 7.

A waveguide 2 is disposed in the upper part of the metal vessel 4 so as to surround the quartz bell jar 3 and a magnetron 1 is mounted on an end portion of the waveguide 2. In this case the microwave generating means is composed of the magnetron 1 and the waveguide 2. A solenoid coil 9 serving as the magnetic field generating means is wound on the outer periphery of the quartz bell jar 3 through the waveguide 2.

In this case the sample table 10 is composed of an insulator 11, an electrode 12 and a dielectric body 13. The electrode 12 is enclosed by the dielectric body 13 and the insulator 11 and a sample 14 such as a wafer is located on the upper surface of the dielectric body 13. In this case a DC power supply 18 for electrostatic attraction and an AC power supply 16 for bias application are connected with the electrode 12 through a matching device 17. The DC power supply 18 is connected therewith through a circuit element 17b consisting of an inductance or a resistor for cutting off high frequencies in the matching device 17. The AC power supply 16 is connected therewith through a circuit element 17a consisting of a capacitor. A gas flow path connected with the plane of the dielectric body 13, on which the sample is placed, is formed in the sample table 10 and the gas flow path is connected with a gas supplying device 19 on the other hand. In this case a cross-shaped groove and a plurality of ring-shaped grooves are formed on the plane, on which the sample is placed, as shown in FIG. 3, so that a thermally conductive gas such as e.g. He gas is supplied uniformly to the rear surface of the sample 14. In this way it is possible to control the temperature of the sample 14 by disposing the gas flow path for making a heating or cooling medium flow to the sample table 10, although this is not shown in the figures.

In the microwave plasma processing apparatus constructed as described above, a processing gas, e.g. an etching gas, supplied from the processing gas supplying device 5 is supplied uniformly at a plurality of places on the inner periphery of the metal vessel 4 through the gas buffer 6, rises upward along the inner surface of the quartz bell jar 3, and is evacuated downward from the vacuum chamber. The pressure in the vacuum chamber is kept at a predetermined level by the evacuating device. In this state, microwaves of 2.45 GHz in this case are produced by the magnetron 1. Microwave power thus produced is introduced into the vacuum chamber through the waveguide 2 and the quartz bell jar 3. On the other hand, a magnetic field having a magnetic field intensity of 875 gauss in this case is formed in the vacuum chamber by the solenoid coil 9 so that magnetic lines of force are approximately perpendicular to the sample 14. Plasma of the etching gas is produced in a plasma generating space 20 formed in the quartz bell jar 3 by the effect of the microwaves and the magnetic field. In the plasma produced in the plasma generating space 20, high density plasma is produced at an area on which the microwaves of 2.45 GHz and the magnetic field of 875 gauss act, i.e. at an ECR (ECR: Electron Cyclotron Resonance) region 21.

A high frequency voltage of several tens of kHz to several tens of MHz is applied between the electrode 12 and the ground electrode 15 by the AC power supply 16 through the matching device 17. Since the ground electrode 15 is located at a place where the plasma is relatively intense, the potential difference between the intense plasma and the ground electrode 15 is small and thus the high frequency voltage can be applied stably between the plasma and the sample with a high efficiency, i.e. without fluctuations. The application of this high frequency voltage gives rise to a bias voltage and thus ions in the plasma can be pulled towards the sample 14 in a uniform direction and it is possible to perform stably an anisotropic etching with a high rate. According to an experiment, it was found that the plasma can be formed stably without fluctuations if the ground electrode is set at such a position that the distance $L_1$ from the ECR region 21 to the upper portion of the ground electrode 15 is approximately equal to $\frac{1}{2}$, or $\frac{1}{2}$ multiplied by an integer, of the guide wavelength $\lambda g$ of the microwaves. Further, it is preferable that the distance $L_2$ from the upper portion of the ground electrode 15 to the sample 14 is set at about $(n+1)\cdot\lambda g/2$, where n is an integer such as 0, 1, 2, .... Here, for the magnitude of $L_1$ and $L_2$, since the insulating or semiconducting thin film 15b on the ground electrode is extremely thin, the thickness of the insulating or semiconducting thin film 15b can be neglected. Further, it is preferable that the surface area of the ground electrode 15 in greater than the surface area of the sample 14.

Furthermore, since the ground electrode 15 is covered by the insulating or semiconducting thin film 15b made of alumina, aluminum fluoride, chromium oxide, silicon carbide, etc., which is as thin as several tens to several hundreds of micrometers so that it has no influence on the application of the high frequency voltage, the metal 15a constituting the ground electrode is not exposed directly to the plasma. Since it is not subjected to sputter, etc., by ions in the plasma, the metal is not consumed by the plasma and thus it is possible to prevent metal contamination.

According to an embodiment described above, since the ground electrode covered by the insulating or semiconducting thin film which is so thin that it has no influence on the application of the high frequency voltage is located in the neighborhood of the place where intense plasma is generated in the plasma generating space surrounded by the insulator, i.e. it is located on the microwave introduction side with respect to the plane of the sample table on which the sample is placed, so as to surround the sample table, the ground electrode is not consumed by the plasma. Thus, it is possible to obtain a stable plasma having no fluctuations in the intensity of the plasma and to effect a stable plasma processing without any metal contamination.

Further, since a part of the ground electrode 15 constitutes a part of the gas introduction path so that the processing gas is supplied to the upper portion along the inner surface of the quartz bell jay 3 and made flow from the upper to the lower portion of the vacuum chamber, the gas is supplied to the neighborhood of the place where intense plasma is produced, and always new processing gas is supplied thereto. In this way a processing can be effected with a high efficiency, i.e. with a high rate.

Although in the present embodiment the ECR region 21 has been described as an area where the microwaves of 2.45 GHz and the magnetic field of 875 gauss act as an example, this is not limited thereto because the intensity of the magnetic field satisfying the ECR condition varies if the frequency of the microwaves varies.

Although in the present embodiment the waveguide 2 has been used in this case as means for conveying microwaves from the magnetron 1 into the quartz bell jar, a coaxial cable, etc., may be used instead thereof. Further, the waveguide 2 includes means for monitoring incident and reflected waves by means of an isolator or a directional coupler, etc., although these means are omitted in the figures.

Figure 4:
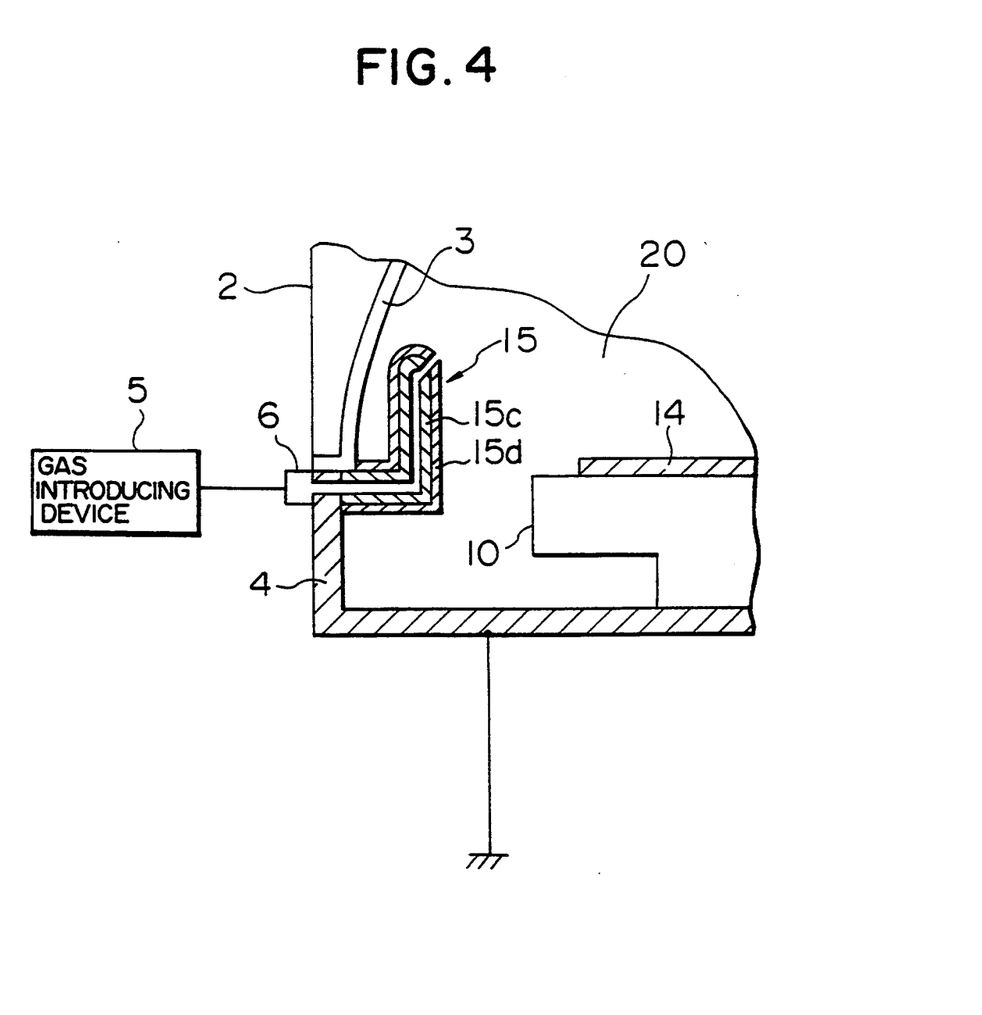
FIG. 4 is a cross-sectional view showing in detail another embodiment of the ground electrode used in the apparatus shown in FIG. 1.

Furthermore, although in the present embodiment the processing gas was supplied by flowing to the upper portion of the quartz bell jar 3 through the gap between the ground electrode 15 and the quartz bell jar 3, the gas flow path may be formed in a metal portion 15c of the ground electrode 15 as shown in FIG. 4 so that the processing gas flows towards the upper portion of the quartz bell jar 3. Also, for the ground electrode 15 shown in FIG. 4, an insulating or semiconducting thin film 15d is formed on the surface of the metal portion 15c.

Next, another embodiment of the present invention will be explained, referring to FIGS. 5 and 6.

Figure 1:
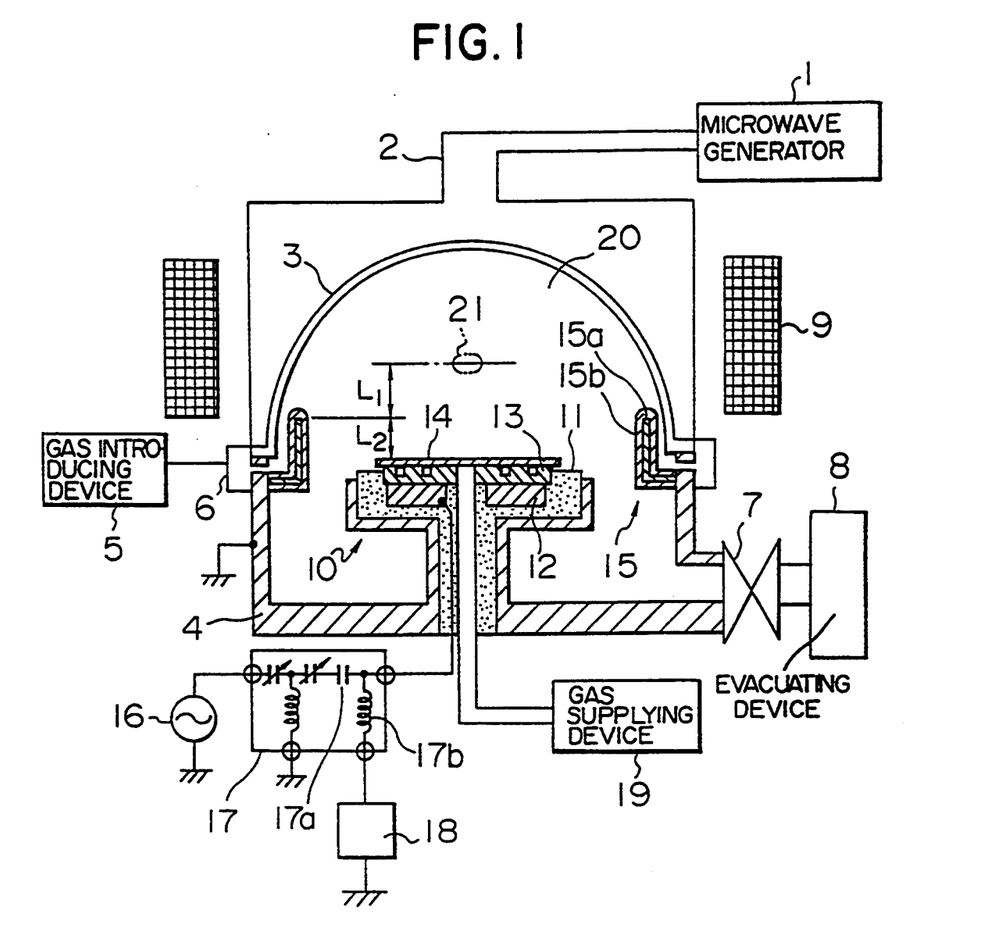
FIG. 1 is a diagram indicating the construction of an embodiment of the microwave plasma processing apparatus according to the present invention.

In these figures, the reference numerals identical to those used in FIG. 1 represent the same members and explanation thereof will be omitted. What is different in the apparatus in these figures from that shown in FIG. 1 is that the upper portion of the ground electrode is formed in a mesh shape, that the gas buffer for supplying the processing gas is formed within the metal vessel, and that only the AC power is applied to the sample table 10. The ground electrode 22 includes a mesh-shaped metal portion on a plane opposite to the surface of the sample 14 to be processed. In this case, the distance $L_1$ between the place where the intensity of the magnetic field gives rise to ECR (ECR region 21) and the distance $L_2$ between the mesh and the surface of the sample 14 to be processed are determined in the manner identical to that used in the embodiment shown in FIGS. 1 to 3. It is desirable that the pitch of the mesh is greater than 10 mm so as not to obstruct ions, particles, etc. The shape of the mesh is not limited to a rectangle as shown in FIG. 6, but a mesh consisting of rings having different radii in the peripheral direction and a cross in the radial direction made of metal, etc., may be used.

Figure 3:
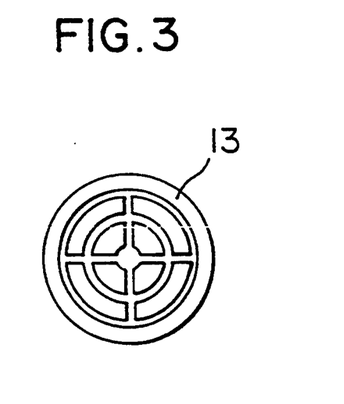
FIG. 3 is a plan view showing the arrangement of a plane made of a dielectric substance, on which a sample is placed.

The ground electrode 22 is covered by an insulating or semiconducting thin film similar to that used in the embodiment shown in FIGS. 1 to 3.

Figure 5:
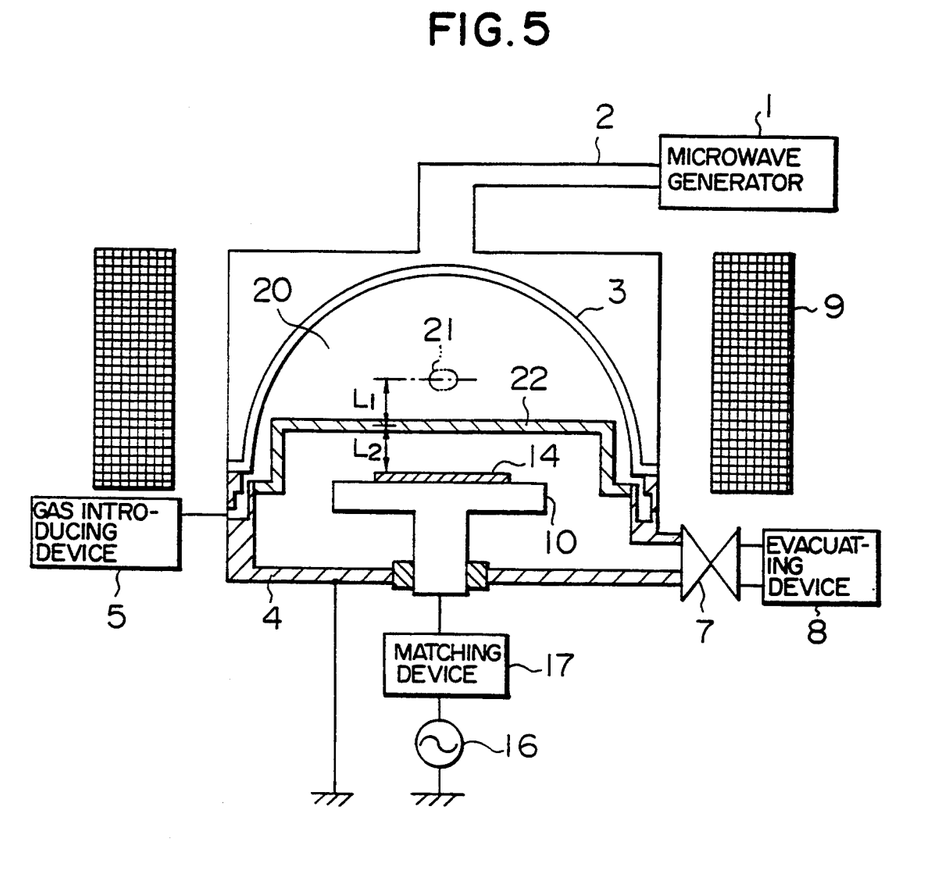
FIG. 5 is a diagram indicating the construction of another embodiment of the microwave plasma processing apparatus according to the present invention.
Figure 6:
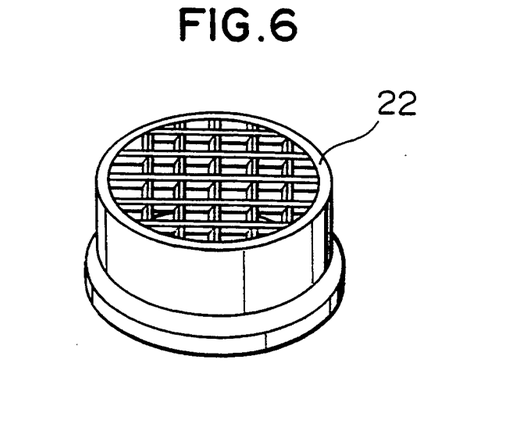
FIG. 6 is a perspective view showing a ground electrode used in the apparatus shown in FIG. 5.

According to the embodiment thus constructed and shown in FIGS. 5 and 6, effects similar to those described for the embodiment shown in FIGS. 1 to 3 are obtained and since it is possible to apply AC electric power to the whole area of the plasma, a more stable plasma can be obtained.

It may happen that a shadow of the mesh is transferred to the surface of the sample 14 due to the fact that the mesh-shaped ground electrode 22 is disposed above the sample 14. This can be avoided by superposing an AC current on the DC flowing through the solenoid coil 9 to displace ions also transversely.

Next, still another embodiment of the present invention will be explained, referring to FIGS. 7 and 8.

In these figures, the reference numerals identical to those used in FIG. 1 represent the same members and explanation thereof will be omitted. The vacuum chamber is composed of a metal vessel 33 and a plate 34 made of quartz mounted hermetically on an aperture in the upper portion of the metal vessel 33. An insulating layer 35 is disposed on the surface of the part forming the plasma generating space 20 in the upper portion of the metal vessel 33. The sample table 10 is formed so as to be extended to the space where the insulating layer 35 is disposed in the metal vessel 33. A waveguide 32 is disposed on the metal vessel 33 covering the quartz window 34 and extending upward and a magnetron 31 is mounted on the upper end portion of the waveguide 33. A gas buffer is formed in the upper portion of the metal vessel 33 so that the processing gas can be supplied from the processing gas supplying device 5 to the upper portion of the discharge space. The evacuating device 8 is connected with the lower portion of the metal vessel 33 through the valve 7. A solenoid coil 36 is wound on the outer periphery of the upper portion of the metal vessel 33. A ground electrode 37 is mounted with the metal vessel 33 disposed to the microwave introduction side with respect to the surface of the sample table on which the sample is placed, and is formed as a doughnut-shaped plate. The ground electrode 37 is connected electrically with the grounded metal vessel 33. The position of the ground electrode 37 is determined by the distances $L_1$ and $L_2$ from the ECR region 21 and the surface of the sample 14 to be processed similarly to the mesh in the embodiment shown in FIGS. 5 and 6 described previously. The outer surface of the ground electrode 37 is covered by a insulating or semiconducting thin film similarly to the embodiment shown in FIGS. 1 to 3.

In the apparatus constructed as described above, the processing gas is supplied directly to the upper portion of the plasma generating space and flows downward to be evacuated there. In this way the pressure is reduced to a predetermined value and kept at that value. In this state, the microwaves and the magnetic field are made act thereon to generate plasma similarly to the embodiment shown in FIGS. 1 to 3. At this time, since the upper portion of the ground electrode 37 is formed as a doughnut-shaped plate, the contact area with the plasma at the distance $L_2$ from the ECR region 21 is increased and it is possible to apply AC electric power to a wide region of the plasma to stabilize the plasma.

As described above, according to the present invention, since effects similar to those obtained by the embodiment shown in FIGS. 1 to 3 are obtained and it is possible to apply AC electric power to a wide region of the plasma, a more stable plasma can be obtained.

Figure 7:
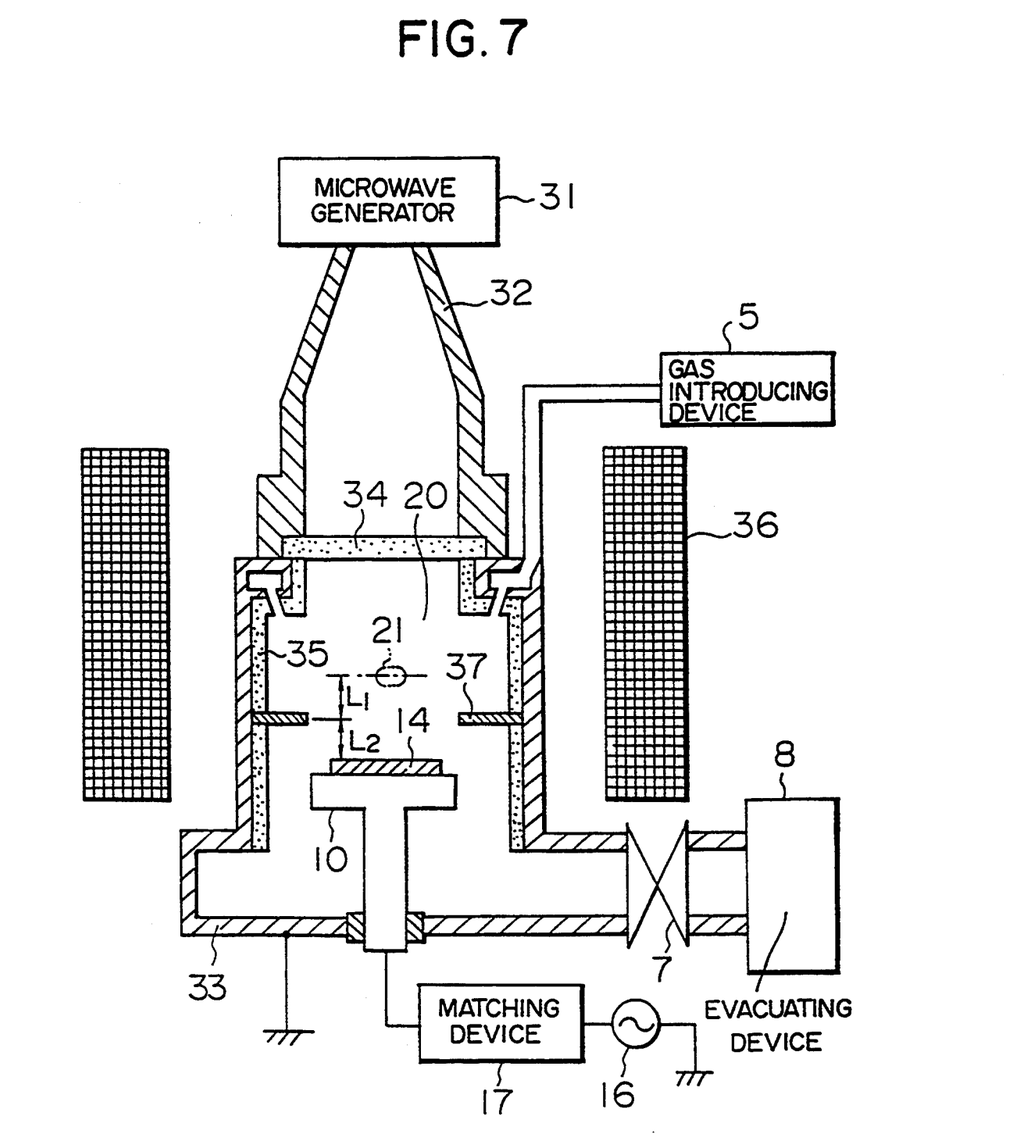
FIG. 7 is a diagram indicating the construction of still another embodiment of the microwave plasma processing apparatus according to the present invention.
Figure 8:
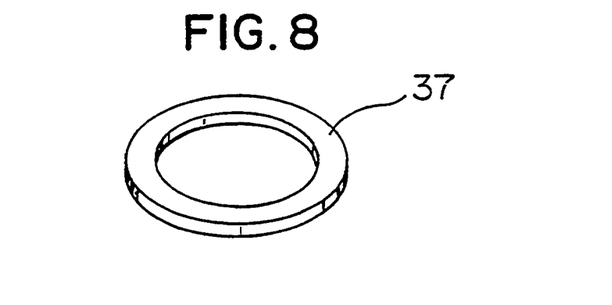
FIG. 8 is a perspective view showing a ground electrode used in the apparatus shown in FIG. 7.

Further, as shown in these embodiments, it is possible to apply AC electric power to the plasma without any metal contamination with a high efficiency not only for the apparatus in which the periphery of the part where discharge takes place is surrounded by an insulating layer, as shown in FIG. 1, but also for the apparatus in which the periphery of the part where discharge takes place is surrounded by metal, as shown in FIG. 7, by disposing the ground electrode whose surface is covered by an insulating or semiconducting thin film on the plasma generating side with respect to the surface of the sample table on which the sample is placed.

Figure 9:
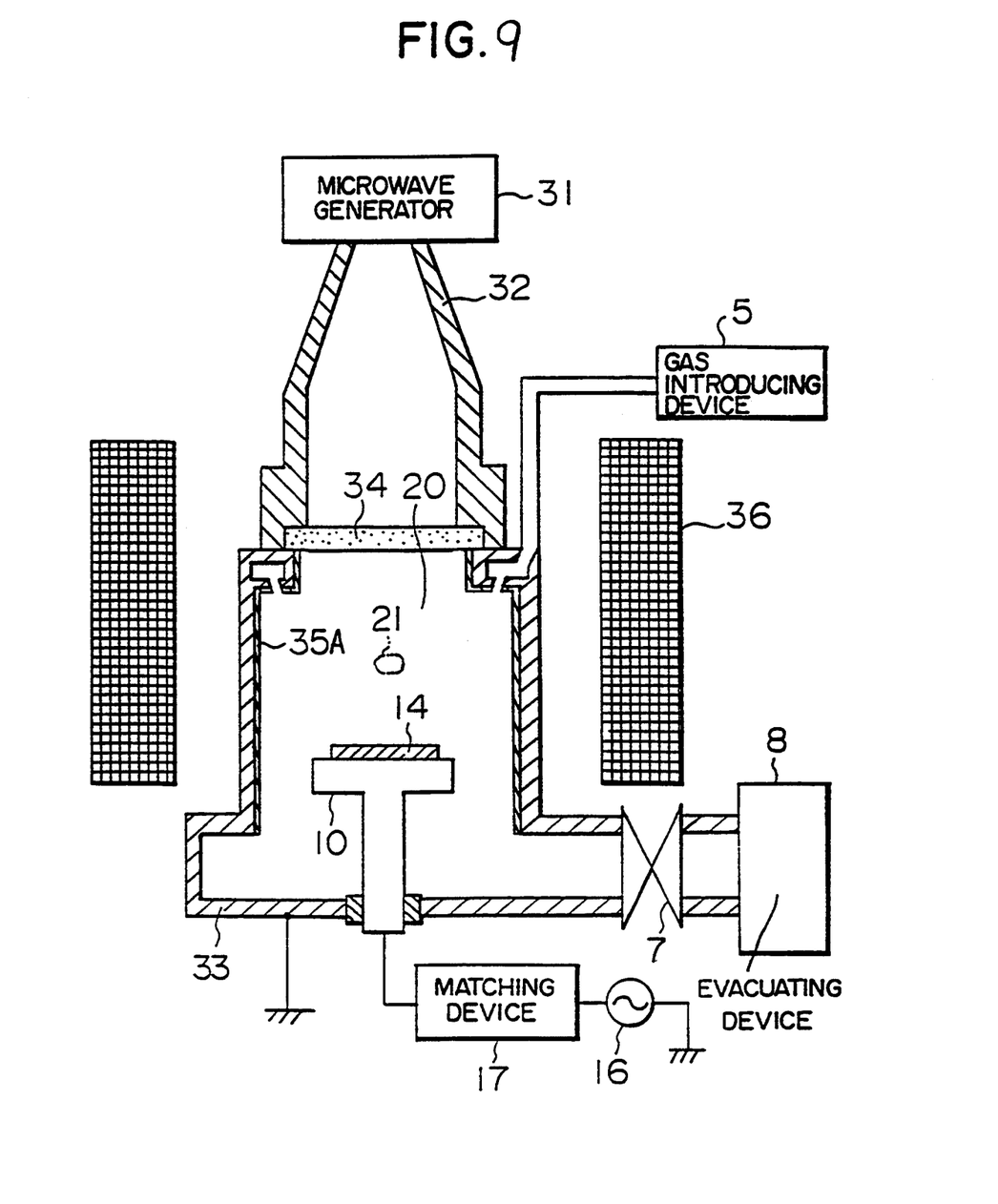
FIG. 9 is a diagram indicating the construction of still another embodiment of the microwave plasma processing apparatus according to the present invention.

Another embodiment of the present invention will be explained, referring to FIG. 9. In this embodiment, the metal vessel 33 serves as a ground electrode for the bias application by the AC power supply 16, and a portion of the inner surface of metal vessel 33 facing the sample 14 mounted on the sample table 10 is covered by an insulating or semiconducting thin film 35A whose thickness is less than 1 mm. This insulating or semiconducting thin film 35A prevents metal contamination from the metal vessel 33 serving as the ground electrode. Therefore, according to this embodiment, the ground electrode 37 in FIG. 7 can be eliminated.

Although in these embodiments examples were given in which etching processing is effected by using etching gas as the processing gas, the present invention can be applied to a sputtering apparatus, a film forming apparatus such as a CVD apparatus, etc., by changing the processing gas.

Although all of the embodiments described above relate to plasma processing of the microwave type, the present invention can be applied to any other type of plasma processing if a high frequency coupling technique such as capacitive coupling, inductive coupling, or direct coupling is used with or without a magnetic field.

According to the present invention, an effect that stable plasma processing can be effected without any metal contamination is obtained.

We claim:

1. A microwave plasma processing apparatus comprising:
   a vacuum chamber which is evacuated to a predetermined pressure and into which processing gas is introduced;
   a sample table, disposed in the vacuum chamber, to which an AC voltage is applied;
   microwave generating means for generating microwaves and introducing the microwaves towards a surface to be processed of a sample located on the sample table;
   magnetic field generating means for generating a magnetic field in the vacuum chamber;
   an insulator disposed on a part of the vacuum chamber exposed to a plasma produced in the vacuum chamber by interaction of the processing gas, the microwaves, and the magnetic field; and
   a ground electrode disposed in the vacuum chamber at a place which is on a microwave introduction side of the vacuum chamber with respect to the surface of the sample table on which the sample is placed, a surface of the ground electrode being covered by a semiconducting thin film.

2. A microwave plasma processing apparatus according to claim 1, wherein the semiconducting thin film is less than 1 mm thick.

3. A microwave plasma processing apparatus according to claim 1, wherein the processing gas is introduced into the microwave introduction side of the vacuum chamber such that the processing gas passes between an inner periphery of the vacuum chamber and the semiconducting thin film.

4. A microwave plasma processing apparatus according to claim 1, wherein the insulator is an electrical insulator.

5. A plasma processing apparatus comprising:
   a vacuum chamber;
   means for evacuating the vacuum chamber to a predetermined pressure;
   means for introducing a processing gas into the vacuum chamber while the evacuating means maintains the vacuum chamber at the predetermined pressure;
   means for generating a plasma in the vacuum chamber from the processing gas in the vacuum chamber;
   a sample table disposed in the vacuum chamber for holding a sample to be subjected to plasma processing by the plasma;
   a ground electrode disposed in the vacuum chamber apart from the sample table and having a surface facing the plasma;
   means for establishing a bias voltage between a sample held on the sample table and the ground electrode such that ions in the plasma are attracted to the sample, thereby subjecting the sample to plasma processing by the plasma; and
   means for preventing the surface of the ground electrode facing the plasma from being affected by the plasma;
   wherein a portion of the vacuum chamber facing the plasma is made of a semiconducting material.

6. A plasma processing apparatus according to claim 5, wherein a portion of the vacuum chamber facing the plasma is made of metal and has a semiconducting layer disposed thereon for preventing the metal from being affected by the plasma.

7. A plasma processing apparatus according to claim 5, wherein the establishing means includes means for applying a voltage to the sample table, thereby applying the voltage to the sample held on the sample table and establishing a bias voltage between the sample held on the sample table and the ground electrode.

8. A plasma processing apparatus according to claim 5, wherein the preventing means includes a semiconducting layer having a thickness of less than 1 mm disposed on the surface of the ground electrode facing the plasma.

9. A plasma processing apparatus according to claim 4, wherein the semiconducting layer is made of alumina.

10. A plasma processing apparatus according to claim 9, wherein the introducing means introduces the processing gas into the vacuum chamber such that the processing gas flows along a portion of the semiconducting layer.

11. A plasma processing apparatus according to claim 5, wherein the ground electrode has a gas flow path formed therein, and wherein the introducing means introduces the processing gas into the vacuum chamber through the gas flow path in the ground electrode.

12. A plasma processing apparatus comprising:

a vacuum chamber having a metal wall;

means for evacuating the vacuum chamber to a predetermined pressure;

means for introducing a processing gas into the vacuum chamber while the evacuating means maintains the vacuum chamber at the predetermined pressure;

means for generating a plasma in the vacuum chamber from the processing gas in the vacuum chamber;

a sample table disposed in the vacuum chamber for holding a sample to be subjected to plasma processing by the plasma;

means for establishing a bias voltage between a sample held on the sample table and the metal wall such that ions in the plasma are attracted to the sample, thereby subjecting the sample to plasma processing by the plasma; and means for preventing a surface of the metal wall facing the plasma from being affected by the plasma.

13. A plasma processing apparatus according to claim 12, wherein the surface of the metal wall facing the plasma is covered with a layer made of one of an insulating material and a semiconducting material, the layer having a thickness of less than 1 mm.

14. A plasma processing apparatus according to claim 12, wherein the metal wall is grounded.

15. A wafer treating apparatus for treating a wafer with a plasma, the wafer treating apparatus comprising:

a chamber defining a first region and having a wall member defining a second region, the wall member having an electrically conductive portion;

means for generating a plasma in the first region;

a wafer holder disposed in the second region for holding a wafer to be subjected to treatment by the plasma, the wafer holder having an electrically conductive portion;

a bias voltage source having a first electrode connected to the electrically conductive portion of the wafer holder and a second electrode connected to the electrically conductive portion of the wall member for applying a bias voltage to a wafer held by the wafer holder to subject the wafer to treatment by the plasma; and a protective layer disposed on a surface of the electrically conductive portion of the wall member facing the wafer held by the wafer holder for preventing the wall member from being affected by the plasma.

16. A wafer treating apparatus according to claim 15, wherein the electrically conductive portion of the wall member is grounded.

17. A method of treating a wafer with a plasma, the method comprising the steps of:

generating a plasma;

disposing a wafer to be subjected to treatment by the plasma;

disposing an electrically conductive member facing the wafer;

grounding the electrically conductive member;

disposing a protective layer on a surface of the grounded electrically conductive member facing the wafer to prevent the grounded electrically conductive member from being affected by the plasma; and establishing a bias voltage between the wafer and the grounded electrically conductive member to cause the plasma to be attracted to the wafer, thereby subjecting the wafer to treatment by the plasma.

* * * * *